United States Patent [19]

Heng et al.

[11] Patent Number: 6,124,559
[45] Date of Patent: Sep. 26, 2000

[54] INTEGRATED CIRCUIT SORTER THAT AUTOMATICALLY PREVENTS BINNING OF INTEGRATED CIRCUITS INTO A WRONG CONTAINER

[75] Inventors: Yiak Khian Heng; Zheng Zhu; Seok Hiong Tan; Chee Keong Tan; Jong Yong Foo, all of Singapore, Singapore

[73] Assignee: Advanced Micro Devices, Inc., Sunnyvale, Calif.

[21] Appl. No.: 09/150,818

[22] Filed: Sep. 11, 1998

Related U.S. Application Data

[63] Continuation-in-part of application No. 08/991,995, Dec. 17, 1997.

[51] Int. Cl.[7] ................................................. B07C 5/344
[52] U.S. Cl. ........................ 209/573; 198/358; 414/294; 414/935; 414/937
[58] Field of Search ................................... 209/572–574; 53/64; 198/358; 414/294, 935, 937

[56] References Cited

U.S. PATENT DOCUMENTS

| 5,348,164 | 9/1994  | Heppler      | 209/573 |
|-----------|---------|--------------|---------|
| 5,869,820 | 2/1999  | Chen et al.  | 414/935 |
| 5,967,293 | 10/1999 | Gaines       | 198/358 |
| 5,996,996 | 12/1999 | Brunelle     | 209/573 |

Primary Examiner—Christopher P. Ellis
Assistant Examiner—Mark A. Deuble
Attorney, Agent, or Firm—Monica H. Choi

[57] ABSTRACT

An integrated circuit sorter automatically prevents the binning of a tested integrated circuit into a wrong container, such as a wrong tube, depending on the results of testing the integrated circuit. The automated integrated circuit sorter includes a respective switch for indicating that each output carries one of good or bad integrated circuits. A container identifier at each output identifies the type of container placed at the output. The container is determined to be for carrying good integrated circuits or bad integrated circuits. If the type of container placed at the output does not correspond to the type of integrated circuits at the output, then an integrated circuit stopper automatically blocks the admission of those integrated circuits into that container. The container identifier includes a light emitter and an optical sensor. A data processor determines whether a correct container or a wrong container is at the output. The data processor communicates with the integrated circuit sorter for affecting action of the integrated circuit stopper via the integrated circuit sorter. A data processor disable jumper may be coupled to the integrated circuit sorter to allow manual control of the integrated circuit stopper. Such a data processor disable jumper is especially advantageous in the event any component of the present invention is inoperative when the integrated circuit sorter may advantageously be manually controlled.

38 Claims, 4 Drawing Sheets

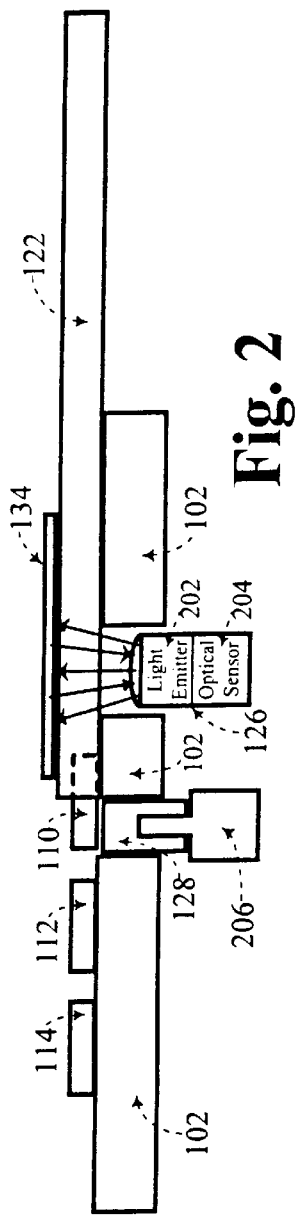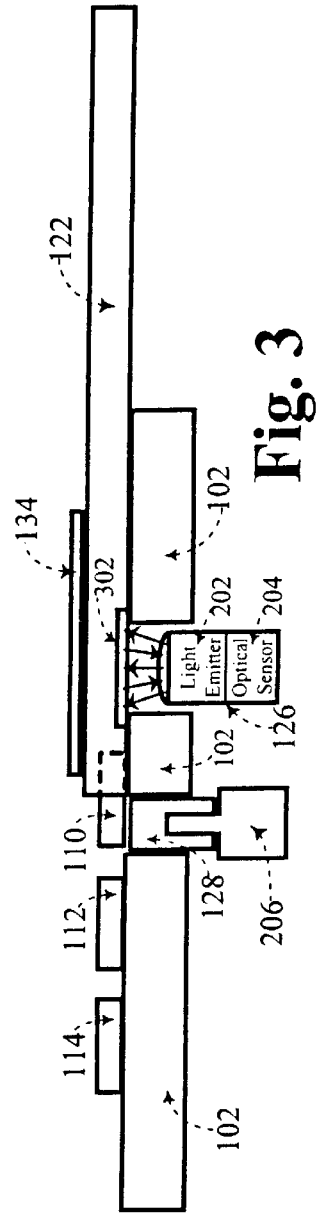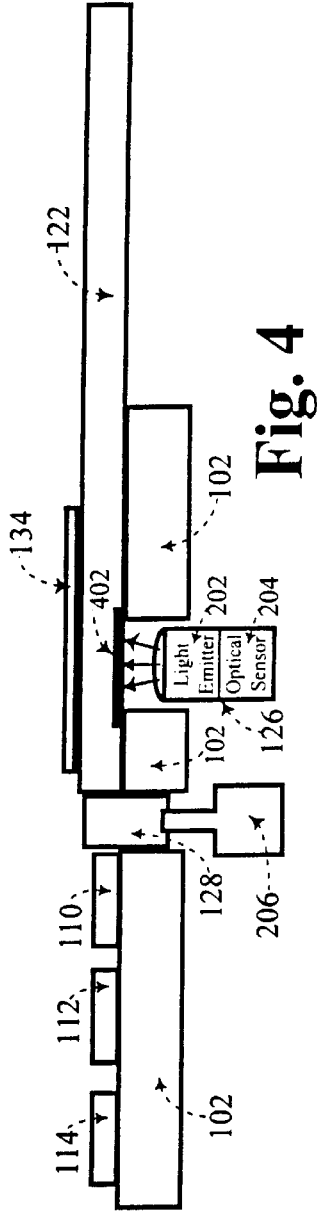

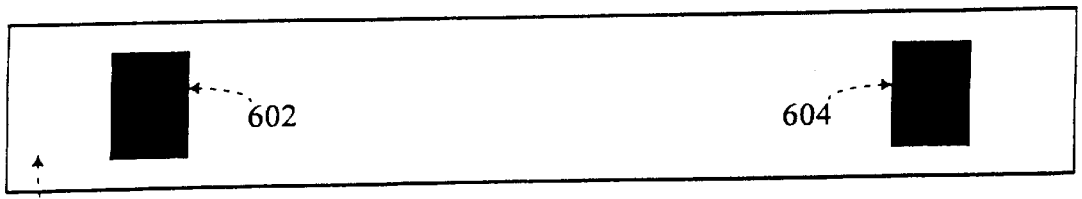
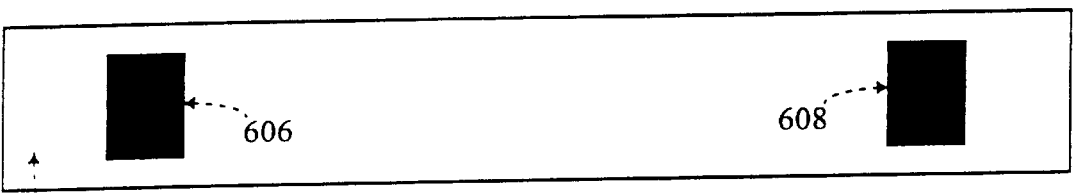
Fig. 6
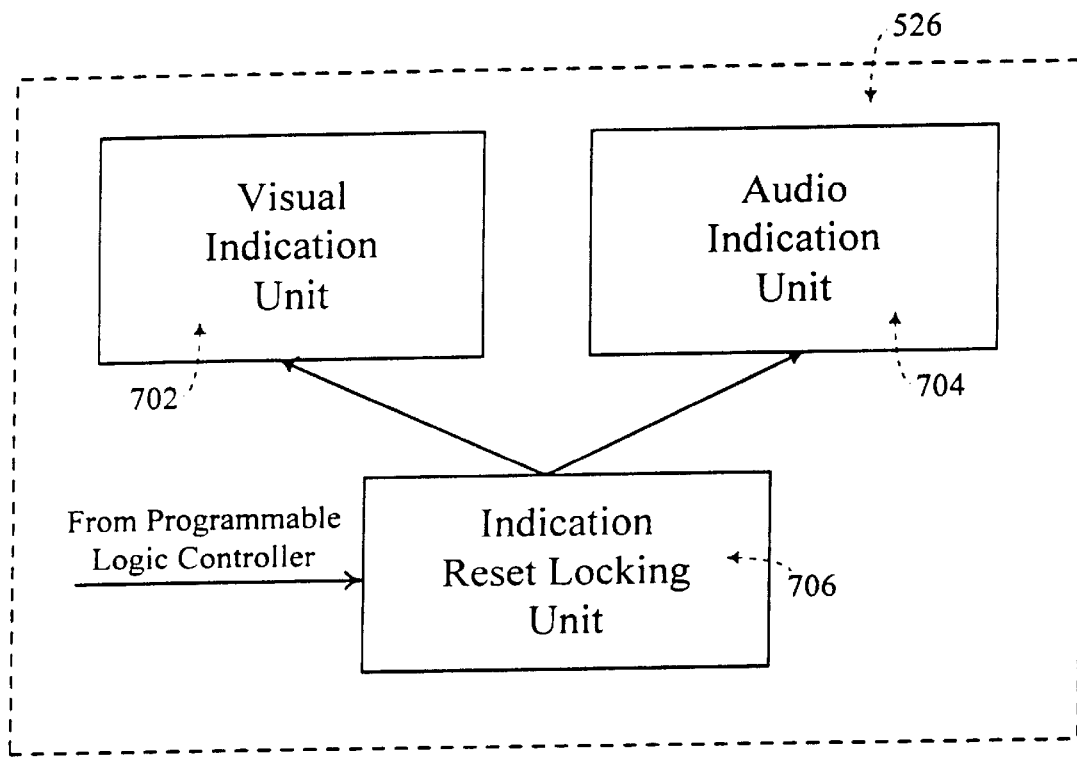
Fig. 7

INTEGRATED CIRCUIT SORTER THAT AUTOMATICALLY PREVENTS BINNING OF INTEGRATED CIRCUITS INTO A WRONG CONTAINER

This is a continuation-in-part of an earlier filed copending patent application, with Ser. No. 08/991,995 filed on Dec. 17, 1997, for which priority is claimed. This earlier filed copending patent application with Ser. No. 08/991,995 is in its entirety incorporated herewith by reference.

TECHNICAL FIELD

This invention relates to integrated circuit testing systems, and more particularly, to an integrated circuit sorter which automatically prevents a tested integrated circuit from being sorted into a wrong container.

BACKGROUND OF THE INVENTION

An integrated circuit (which may include an integrated circuit die mounted on a package) like all other products are subject to inspection before distribution to customers. Such inspection includes testing of the integrated circuit for proper functionality. An example of such an integrated circuit testing system is the Delta Flex Test Handler, Model 1240, available from Delta Design, Inc., San Diego, Calif.

After testing, an integrated circuit is sorted according to the result of such testing. For example, an integrated circuit that shows successful operation is sorted into a good integrated circuit tube for distribution to customers. On the other hand, an integrated circuit that shows failed operation is sorted into a bad integrated circuit tube for further investigation or for discarding. The good integrated circuit tube and the bad integrated circuit tube typically have a distinguishing appearance from each other (for example, different colors) such that the contents of the tubes are readily determined. An example of such an integrated circuit sorter for binning tested integrated circuits is the AET Handler available from Aetrium, Inc., North St. Paul, Minn.

In the conventional integrated circuit sorter, a sorter operator places an appropriate tube at an output track carrying the tested integrated circuits. A particular output track is designated as carrying one of good integrated circuits (i.e., integrated circuits which showed successful operation during testing) or bad integrated circuits (i.e., integrated circuits which showed failed operation during testing). The sorter operator then places the appropriate tube at the output track depending on whether that output track carries good or bad integrated circuits.

A manual placement of the tube on the output track is prone to human error. The sorter operator may place a wrong tube on the output track. For example, if an output track carries good integrated circuits, the sorter operator should place a good integrated circuit tube on that output track for receiving the good integrated circuits. If by human error, a bad integrated circuit tube is placed on that output track, then the integrated circuit manufacturer loses profits in discarding good integrated circuits.

Conversely, if an output track carries bad integrated circuits, the sorter operator should place a bad integrated circuit tube on that output track for receiving the bad integrated circuits. If by human error, a good integrated circuit tube is placed on that output track, then the integrated circuit manufacturer's reputation may be jeapordized when customers receive inoperative integrated circuits.

SUMMARY OF THE INVENTION

Accordingly, a primary object of the present invention is to automate the integrated circuit sorter to prevent binning of a tested integrated circuit into a wrong container, such as a wrong tube.

In a general aspect of the present invention, an automated integrated circuit sorter includes a respective switch for an output carrying the integrated circuit. The respective switch indicates that the integrated circuit is one of a good integrated circuit and a bad integrated circuit. The present invention also includes a container identifier for determining that a container placed on the output is one of a good integrated circuit container and a bad integrated circuit container. The integrated circuit sorter of the present invention further includes a stopper coupled to the output, and a test handler driver, coupled to the stopper, which drives the stopper for determining action of the stopper. The present invention further includes a data processor, operatively coupled to the respective switch and the container identifier, for determining when the container is a wrong container. In addition, the present invention includes a data processor interface, operatively coupled between the data processor and the test handler driver, for interfacing communications between the data processor and the test handler driver. The data processor communicates with the test handler driver through the data processor interface to drive the stopper to prevent the integrated circuit from being admitted into the container when the container is a wrong container.

In another aspect of the present invention, a data processor disable jumper, coupled to the test handler driver, disables communications from the data processor to the test handler driver such that communications from a manual controller unit to the test handler driver overrides communications from the data processor to the test handler driver.

In a further aspect of the present invention, a visual and audio indication unit alerts a sorter operator that a wrong container has been placed on the output carrying the integrated circuit. Furthermore, an indication reset locking unit resets the visual and audio indication unit after the sorter operator replaces the wrong container with a correct container.

The present invention may be used to particular advantage when the container identifier further comprises an infra-red light emitter, disposed adjacent the container on the output, for emitting a light toward the container. The container identifier also includes an optical sensor disposed in a potential path of the light emitted from the infra-red light emitter for detecting the type of integrated circuit container placed on the output carrying the integrated circuit.

These and other features and advantages of the present invention will be better understood by considering the following detailed description of the invention which is presented with the attached drawings.

BRIEF DESCRIPTION OF THE DRAWINGS

FIG. 2 shows a cross-sectional view of the integrated circuit sorter of FIG. 1, when a tube for receiving the integrated circuit is a correct tube;

FIG. 3 shows a cross-sectional view of the integrated circuit sorter of FIG. 1, when a tube for receiving the integrated circuit is a correct tube, according to another embodiment of the present invention;

FIG. 4 shows a cross-sectional view of the integrated circuit sorter of FIG. 1, when a tube for receiving the integrated circuit is a wrong tube;

FIG. 6 shows efficient placement of patches on an integrated circuit container, according to another embodiment of the present invention; and FIG. 7 shows a visual and audio indication unit, according to another embodiment of the present invention.

The figures referred to herein are drawn for clarity of illustration and are not necessarily drawn to scale. Moreover, elements having the same reference number in FIGS. 1, 2, 3, 4, 5, 6, and 7 refer to elements having similar structure and function.

DETAILED DESCRIPTION

Figure 1:
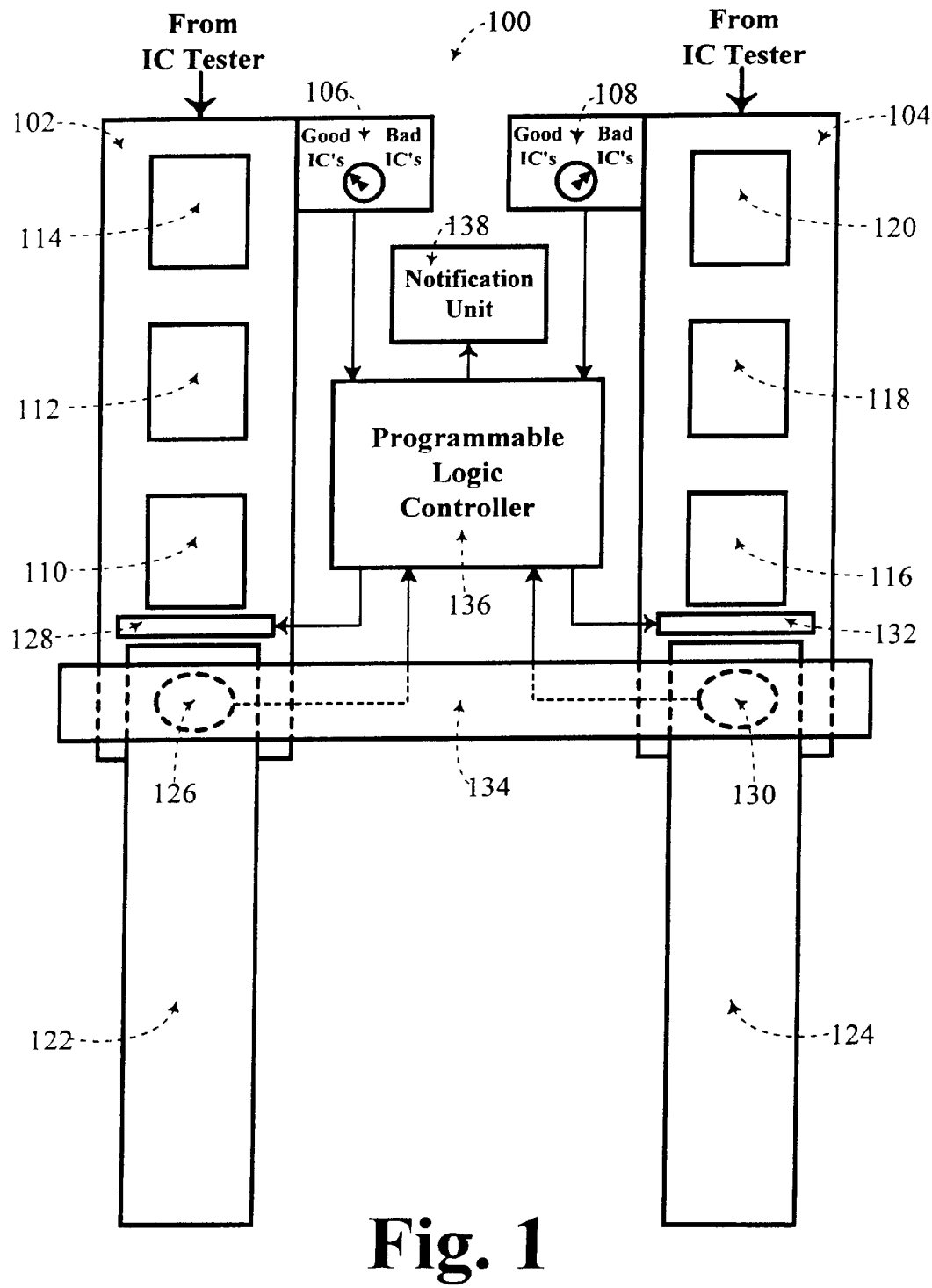
FIG. 1 shows an integrated circuit sorter, according to one embodiment of the present invention.

Referring to FIG. 1, an integrated circuit sorter 100 according to a preferred embodiment of the present invention includes a first output track 102 and a second output track 104 which are outputs carrying the tested integrated circuits to be sorted. These integrated circuits are from an IC (Integrated Circuit) tester and are ready to be sorted into an appropriate container depending on the results of the testing.

Each of the output tracks 102 and 104 includes a respective switch. The first output track 102 has a first switch 106, and the second output track 104 has a second switch 108. The respective switch for an output track indicates whether that output track carries good IC's (Integrated Circuits) or bad IC's (Integrated Circuits). Good IC's show successful operation during testing, and bad IC's show failed operation during testing.

In the example illustration of FIG. 1, the first switch 106 designates that the first output track 102 carries good IC's, and the second switch 108 designates that the second output track 104 carries bad IC's. Thus, the first output track 102 carries a first integrated circuit 110, a second integrated circuit 112, and a third integrated circuit 114 which are good IC's. On the other hand, the second output track 104 carries a fourth integrated circuit 116, a fifth integrated circuit 118, and a sixth integrated circuit 120 which are bad IC's.

Each of the output tracks 102 and 104 has a respective container such as a tube placed on the end of the output track for receiving the tested integrated circuits carried by that output track. The first output track 102 has a first tube 122 disposed at the end of the first output track 102, and the second output track 104 has a second tube 124 disposed at the end of the second output track 104.

The first tube 122 placed on the first output track 102 which carries good IC's should be a good integrated circuit tube for receiving the good IC's. The second tube 124 placed on the second output track 104 which carries bad IC's should be a bad integrated circuit tube for receiving the bad IC's. A good integrated circuit tube and a bad integrated circuit tube have distinguishing appearances such that their contents may be readily determined. For example, a good integrated circuit tube may be comprised of a clear plastic material whereas a bad integrated circuit tube may be comprised of a plastic material having a pink-colored tint.

A sorter operator places the appropriate tube on each of the output tracks 102 and 104 as the tested integrated circuits come down the output tracks 102 and 104. Placement of a wrong tube by the sorter operator due to human error has undesirable consequences. For example, if by human error, a bad integrated circuit tube is placed on the first output track 102 which carries good IC's, then the integrated circuit manufacturer loses profits in discarding good IC's. If by human error, a good integrated circuit tube is placed on the second output track 104 which carries bad IC's, then the integrated circuit manufacturer's reputation may be jeopardized when customers receive inoperative integrated circuits.

Thus, each of the output tracks 102 and 104 further includes elements for automatically preventing the binning of integrated circuits into a wrong tube due to such human error. Each of the output tracks 102 and 104 includes a tube identifier and an integrated circuit stopper. The first output track 102 has a first tube identifier 126 and a first integrated circuit stopper 128. The second output track 104 has a second tube identifier 130 and a second integrated circuit stopper 132.

In addition, a tube guide 134 guides the placement of the tubes 122 and 124 onto the end of the respective output tracks 102 and 104. A PLC (Programmable Logic Controller) 136 which is a data processor is operatively coupled to the first and second switches, 106 and 108 respectively, to the first and second tube identifiers, 126 and 130 respectively, and to the first and second integrated circuit stoppers, 128 and 132 respectively. A notification unit 138 is operatively coupled to the PLC 136 for notifying a sorter operator when a wrong tube is placed in an output track.

The operation of the integrated circuit sorter 100 according to a preferred embodiment of the present invention is described with reference to FIGS. 2–3. Note that elements having the same reference numeral in FIGS. 1–4 refer to the same element. The operation of automatically preventing the binning of integrated circuits into a wrong tube at the first output track 102 carrying good IC's is hereafter described. However, the similar operation of the second output track 104 carrying bad IC's should be apparent to one of ordinary skill in the art from the description of operation at the first output track 102.

Referring to FIGS. 1 and 2, the first switch 106 indicates that the first output track 102 carries good IC's. The first switch 106, operatively coupled to the PLC 136, indicates to the PLC 136 that the first output track 102 carries good IC's.

When the first tube 122 is placed on the first output track 102, the first tube identifier 126 determines whether the first tube 122 is a good integrated circuit tube or a bad integrated circuit tube. The first tube identifier 126 includes a light emitter 202 for emitting a light toward the first tube 122, and also includes an optical sensor 204 disposed in a reflective path of the light being reflected from a reflective surface when the first tube 122 is a good integrated circuit tube.

FIG. 2 illustrates the scenario when the first tube 122 is a proper tube. Since the first output track 102 has been designated by the first switch 106 to carry good IC's, the first tube 122 should be a good integrated circuit tube 122 to be a proper tube. A good integrated circuit tube may be comprised of a transparent material that allows the light emitted by the light emitter 202 to travel through the tube. This light is reflected by the tube guide 134 which may be comprised of a reflective material such as metal. The reflected light is detected by the optical sensor 204, and the optical sensor sends a signal to the PLC 136 that a reflected light has been detected. The PLC 136 determines that the first tube 122 is a good integrated circuit tube which is a proper tube from the detection of the reflected light.

In the case the first tube 122 is a proper tube, the PLC 136 controls the integrated circuit stopper 128 to be lowered, and the integrated circuits 110, 112, and 114 on the first output track 102 are admitted into the first tube 122. The integrated circuit stopper 128 includes a pin cylinder piston 206 which raises and lowers the integrated circuit stopper 128 near the opening of the first tube 122.

Referring to FIG. 3, in an alternative embodiment of the present invention, a good integrated circuit tube placed on the first output track 102 may include a reflective patch 302. This reflective patch 302 is disposed over the first integrated circuit identifier 126 and reflects the light emitted by the light emitter 202. The optical sensor 204 detects this reflected light as an indication that such a tube is a proper tube resulting in admission of the integrated circuits 110, 112, and 114 into this tube 122.

FIG. 4 illustrates operation of the present invention when the first tube 122 is a wrong tube. Since the first switch 106 indicates that the first output track 102 carries good IC's, the first tube 122 is a wrong tube if the first tube 122 is a bad integrated circuit tube. For example, a wrong integrated circuit tube may have a pink color tint and may include a black patch 402. This black patch 402 is disposed over the first integrated circuit identifier 126 and absorbs the light emitted by the light emitter 202. When the optical sensor 204 detects substantially less reflected light (than detected if a proper tube were placed in the first output track 102), the optical sensor sends a signal to the PLC 136 that substantially less reflected light has been detected. The PLC 136 determines that the first tube 122 is a bad integrated circuit tube which is a wrong tube from the detection of substantially less reflected light.

In the case the first tube 122 is a wrong tube, the PLC 136 controls the integrated circuit stopper 128 to be raised, and the integrated circuits 110, 112, and 114 on the first output track 102 are prevented from being admitted into the first tube 122. In addition, the PLC 136 controls the notification unit 138 to notify a sorter operator that a wrong tube has been placed in the first output track 102 such that the sorter operator may remedy this undesirable situation.

In this manner, the present invention automatically prevents the binning of integrated circuits into a wrong tube. Good IC's are prevented from being admitted into bad integrated circuit tubes thereby avoiding profit loss from discarding good IC's. On the other hand, bad IC's are prevented from being admitted into good integrated circuit tubes thereby avoiding reputation loss from shipping of bad IC's to the customers.

Figure 5:
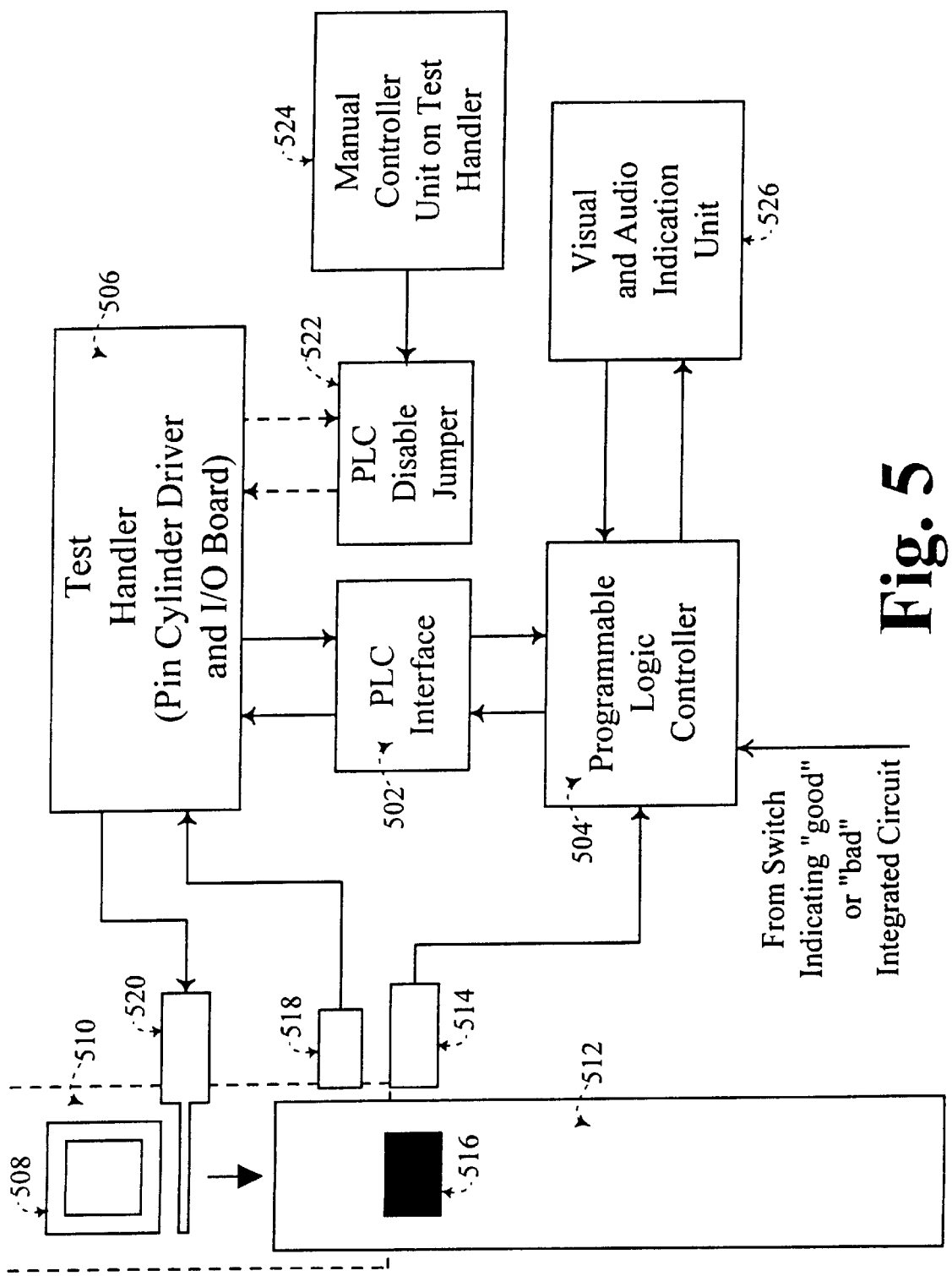
FIG. 5 shows an integrated circuit sorter, according to another embodiment of the present invention, that allows communications between an integrated circuit test handler and a data processor that determines whether a tube for receiving the integrated circuit is a wrong tube or a correct tube.

Referring to FIG. 5, another embodiment of the present invention includes a PLC (programmable logic controller) interface 502 that interfaces communications between a data processor such as a programmable logic controller 504 and a test handler having a test handler driver 506. An integrated circuit 508 is carried on an output 510. An integrated circuit container 512 is placed on the output 510 for potentially receiving the integrated circuit 508.

As previously described with respect to FIGS. 1, 2, 3, and 4, an optical sensor 514 determines whether the container 512 is a good integrated circuit container or a bad integrated circuit container. The container 512 includes a patch 516 which may be a light reflecting or a light absorbing patch. In addition, the embodiment of the present invention of FIG. 5 may further include a tube present sensor 518 that indicates whether a container is present on the output 510 carrying the integrated circuit 508.

A stopper such as a pin cylinder 520 is lowered to allow the integrated circuit 508 into the container 512 or is raised to prevent the integrated circuit 508 from being admitted into the container 512 as discussed with FIGS. 2, 3, and 4. In the embodiment of the present invention of FIG. 1, the programmable logic controller 136 directly drives the integrated circuit stoppers 128 and 132. However, in the embodiment of the present invention of FIG. 5, the programmable logic controller 504 communicates with the test handler driver 506. The test handler driver 506 determines the action of the pin cylinder stopper 520 by driving the pin cylinder stopper 520.

The programmable logic controller 504 receives input from the switch for the output 510 that indicates whether the output is carrying good integrated circuits or bad integrated circuits. The programmable logic controller 504 also receives from the optical sensor 514 an indication of whether the container 512 is a good integrated circuit container or a bad integrated circuit container.

Based upon these inputs, the programmable logic controller 504 communicates with the test handler driver 506 through the PLC interface 502. If the container is a correct container, then the programmable logic controller communicates with the test handler driver to drive the pin cylinder stopper 520 to admit the integrated circuit 508 into the container 512. The container 512 is a correct container if the integrated circuit is a good integrated circuit and the container is a good integrated circuit container, and if the integrated circuit is a bad integrated circuit and the container is a bad integrated circuit container.

If the container is a wrong container, then the programmable logic controller communicates with the test handler driver to drive the pin cylinder stopper 520 to prevent the admission of the integrated circuit 508 into the container 512. The container 512 is a wrong container if the integrated circuit is a good integrated circuit and the container is a bad integrated circuit container, and if the integrated circuit is a bad integrated circuit and the container is a good integrated circuit container.

In the embodiment of the present invention of FIG. 5, the test handler driver 506 drives the pin cylinder stopper 520 to determine the action of the stopper 520. Thus, if any of the optical sensor 514, the programmable logic controller 504, and the PLC interface 502 were to be inoperative, the pin cylinder stopper 520 may still be driven by the test handler driver 506.

If any of such components were inoperative, the sorter operator couples a PLC (programmable logic controller) disable jumper 522 to the test handler driver 506. A manual controller unit 524, which may be on the test handler and which is coupled to the PLC disable jumper, may be used by the sorter operator to manually control the action of the pin cylinder stopper 520 through the test handler driver 506. When the PLC disable jumper 522 is coupled to the test handler driver 506, communications from the manual controller unit 524 to the test handler driver 506 overrides communications from the data processor of the programmable logic controller 504 to the test handler driver 506. In this manner, the integrated circuit sorter may still be operated manually even when a component of the present invention is inoperative.

In another embodiment of the present invention, the light emitter 202 as shown in FIGS. 2, 3, and 4 is an infra-red light emitter. Using an infra-red light emitter with a corresponding optical sensor 204 in FIGS. 2, 3, and 4 and the optical sensor 514 in FIG. 5 is especially advantageous because of the low cost and the sensitivity of such sensors to such light.

In a further embodiment of the present invention, patches which are used on the container as shown in FIGS. 3 and 4 are disposed on each of the four ends of an container. Referring to FIG. 6, a first patch 602 is disposed at a first end of the top surface of the container 512, and a second patch 604 is disposed at a second end of the top surface of the container 512. A third patch 606 is disposed at a first end of the bottom surface of the container 512, and a fourth patch 608 is disposed at a second end of the bottom surface of the container 512.

With such patches, a sorter operator may place the container in any of the four orientations on the output 510, and the present invention would still automatically determine whether the container 512 is a correct container or a wrong container. Thus, with such a configuration of the patches, the present invention is less prone to human error from misplacement of the container 512 on the output 510. Referring to FIGS. 3 and 6, the four patches 602, 604, 606, and 608 may be four light reflecting patches such as patch 302 of FIG. 3 for reflecting the light emitted by the light emitter 202. Referring to FIGS. 4 and 6, the four patches 602, 604, 606, and 608 may be four light absorbing patches such as patch 402 for absorbing the light emitted by the light emitter 202.

Referring to FIGS. 5 and 7, in another embodiment of the present invention, when a wrong container is placed on the output 510, a visual and audio indication unit 526 includes a visual indication unit 702 such as a LED blinker and an audio indication unit 704 such as a buzzer for alerting the sorter operator that a wrong container has been placed on the output 510. In addition, the present invention includes an indication reset locking unit 706 which resets the visual and audio indication unit after the sorter operator replaces the wrong container with a correct container.

The indication reset locking unit 706 prevents the sorter operator from resetting the visual and audio indication unit to ignore the warning that a wrong container has been placed in the output 510. The indication reset locking unit 706 allows the sorter operator to reset the visual and audio indication unit when the wrong container has been replaced with a correct container. The indication reset locking unit 706 receives input from the programmable logic controller for determining whether the wrong container has been replaced with a correct container.

The foregoing is by way of example only and is not intended to be limiting. For example, the advantageous features of the present invention may be used in conjunction with any number of output tracks carrying tested integrated circuits. In addition, the operation at an output track carrying bad IC's may be readily discerned by one of ordinary skill in the art by the description of the operation at the first output track 102 of FIG. 1 carrying good IC's. The integrated circuit tubes described herein are by way of example only, and the present invention may be used with any integrated circuit containers wherein a good container allows reflection of emitted light and wherein a bad container absorbs emitted light, or vice versa. The PLC 136 of FIG. 1 or any other type of data processor may be programmed to handle such various possibilities. The invention is limited only as defined in the following claims and equivalents thereof.

We claim:

1. An automated integrated circuit sorter for preventing binning of an integrated circuit into a wrong container, the automated integrated circuit sorter comprising:
   a respective switch for an output carrying the integrated circuit, the respective switch indicating that the integrated circuit is one of a good integrated circuit and a bad integrated circuit;
   a container identifier for determining that a container placed on the output is one of a good integrated circuit container and a bad integrated circuit container;
   a stopper coupled to the output;
   a test handler driver, coupled to the stopper, which drives the stopper for determining action of the stopper;
   a data processor, operatively coupled to the respective switch and the container identifier, for determining when the container is a wrong container, the container being a wrong container if the integrated circuit is a good integrated circuit and the container is a bad integrated circuit container, and if the integrated circuit is a bad integrated circuit and the container is a good integrated circuit container; and
   a data processor interface, operatively coupled between the data processor and the test handler driver, for interfacing communications between the data processor and the test handler driver, the data processor communicating with the test handler driver through the data processor interface to drive the stopper to prevent the integrated circuit from being admitted into the container when the container is a wrong container.

2. The automated integrated circuit sorter of claim 1, further comprising:
   a data processor disable jumper, coupled to the test handler driver, for disabling communications from the data processor to the test handler driver such that communications from a manual controller unit to the test handler driver overrides communications from the data processor to the test handler driver.

3. The automated integrated circuit sorter of claim 1, further comprising:
   a visual and audio indication unit for alerting a sorter operator that a wrong container has been placed on the output carrying the integrated circuit; and
   an indication reset locking unit, coupled to the data processor and the visual and audio indication unit, for resetting the visual and audio indication unit after the sorter operator replaces the wrong container with a correct container, the container being a correct container if the integrated circuit is a good integrated circuit and the container is a good integrated circuit container, and if the integrated circuit is a bad integrated circuit and the container is a bad integrated circuit container.

4. The automated integrated circuit sorter of claim 1, wherein the container identifier further comprises:
   an infra-red light emitter, disposed adjacent the container on the output, for emitting a light toward the container; and
   an optical sensor disposed in a reflective path of said light being reflected from a reflective surface when the container is a good integrated circuit container, said light being absorbed by the container when the container is a bad integrated circuit container.

5. The automated integrated circuit sorter of claim 4, wherein the good integrated circuit container has four patches for reflecting said light from the infra-red light emitter, each of the four patches being disposed at a respective one of the ends of a top surface and a bottom surface of the good integrated circuit container.

6. The automated integrated circuit sorter of claim 4, wherein the bad integrated circuit container has four patches for absorbing said light from the infra-red light emitter, each of the four patches being disposed at a respective one of the ends of a top surface and a bottom surface of the bad integrated circuit container.

7. The automated integrated circuit sorter of claim 1, wherein the container identifier further comprises:

an infra-red light emitter, disposed adjacent the container on the output, for emitting a light toward the container; and an optical sensor disposed in a reflective path of said light being reflected from a reflective surface when the container is a bad integrated circuit container, said light being absorbed by the container when the container is a good integrated circuit container.

8. The automated integrated circuit sorter of claim 7, wherein the bad integrated circuit container has four patches for reflecting the light from the infra-red light emitter, each of the four patches being disposed at a respective one of the ends of a top surface and a bottom surface of the bad integrated circuit container.

9. The automated integrated circuit sorter of claim 7, wherein the good integrated circuit container has four patches for absorbing the light from the infra-red light emitter, each of the four patches being disposed at a respective one of the ends of a top surface and a bottom surface of the good integrated circuit container.

10. A method for automatically preventing binning of a tested integrated circuit into a wrong container, the method including the steps of:

A. designating that the integrated circuit on an output is one of a good integrated circuit and a bad integrated circuit;

B. sensing that a container placed on the output is one of a good integrated circuit container and a bad integrated circuit container;

C. driving a stopper coupled to the output, from a test handler driver which drives the stopper for determining action of the stopper;

D. determining when the container is a wrong container from a data processor, the container being a wrong container if the integrated circuit is a good integrated circuit and the container is a bad integrated circuit container, and if the integrated circuit is a bad integrated circuit and the container is a good integrated circuit container; and E. sending a control signal from the data processor to the test handler driver through a data processor interface to drive the stopper to prevent the integrated circuit from being admitted into the container when the container is a wrong container.

11. The method of claim 10, further including the step of:

disabling communications from the data processor to the test handler driver through the data processor interface such that communications from a manual controller unit to the test handler driver overrides communications from the data processor to the test handler driver.

12. The method of claim 10, further including the steps of:

alerting a sorter operator with a visual and audio indication unit that a wrong container has been placed on the output carrying the integrated circuit; and resetting the visual and audio indication unit after the sorter operator replaces the wrong container with a correct container.

13. The method of claim 10, wherein said step B further includes the steps of:

emitting a light from an infra-red light emitter toward the container; and sensing the level of said light being reflected with an optical sensor disposed in a reflective path of said light being reflected from a reflective surface when the container is a good integrated circuit container, said light being absorbed by the container when the container is a bad integrated circuit container.

14. The method of claim 13, wherein the good integrated circuit container has four patches for reflecting said light from the infra-red light emitter, each of the four patches being disposed at a respective one of the ends of a top surface and a bottom surface of the good integrated circuit container.

15. The method of claim 13, wherein the bad integrated circuit container has four patches for absorbing said light from the infra-red light emitter, each of the four patches being disposed at a respective one of the ends of a top surface and a bottom surface of the bad integrated circuit container.

16. The method of claim 10, wherein said step B further includes the steps of:

emitting a light from an infra-red light emitter toward the container; and sensing the level of said light being reflected with an optical sensor disposed in a reflective path of said light being reflected from a reflective surface when the container is a bad integrated circuit container, said light being absorbed by the container when the container is a good integrated circuit container.

17. The method claim 16, wherein the bad integrated circuit container has four patches for reflecting said light from the infra-red light emitter, each of the four patches being disposed at a respective one of the ends of a top surface and a bottom surface of the bad integrated circuit container.

18. The method of claim 16, wherein the good integrated circuit container has four patches for absorbing said light from the infra-red light emitter, each of the four patches being disposed at a respective one of the ends of a top surface and a bottom surface of the good integrated circuit container.

19. An automated integrated circuit sorter for preventing binning of an integrated circuit into a wrong container, the automated integrated circuit sorter comprising:

a respective switch for an output carrying the integrated circuit, the respective switch indicating that the integrated circuit is one of a good integrated circuit and a bad integrated circuit;

a container identifier for determining that a container placed on the output is one of a good integrated circuit container and a bad integrated circuit container;

a stopper coupled to the output; and a data processor, operatively coupled to the respective switch, the container identifier, and the stopper, for controlling the stopper to prevent the integrated circuit from being admitted into the container when the container is a wrong container, the container being a wrong container if the integrated circuit is a good integrated circuit and the container is a bad integrated circuit container, and if the integrated circuit is a bad integrated circuit and the container is a good integrated circuit container.

20. The automated integrated circuit sorter of claim 19, wherein the container identifier further comprises:

a light emitter, disposed adjacent the container on the output, for emitting a light toward the container; and an optical sensor disposed in a reflective path of the light being reflected from a reflective surface when the container is a good integrated circuit container, the light being absorbed by the container when the container is a bad integrated circuit container.

21. The automated integrated circuit sorter of claim 20, wherein a good integrated circuit container is comprised of the reflective surface disposed on the good integrated circuit container and disposed in the path of the light emitted by the light emitter.

22. The automated integrated circuit sorter of claim 20, wherein a good integrated circuit container is comprised of a clear material and wherein the reflective surface is a metal container guide disposed on an opposite side of the container from the light emitter and the optical sensor, and wherein the metal container guide reflects the light emitted by the light emitter after the light goes through the container.

23. The automated integrated circuit sorter of claim 20, wherein a bad integrated circuit container is comprised of a black patch disposed in the path of the light emitted by the light emitter for absorbing the light.

24. The automated integrated circuit sorter of claim 19, wherein the container identifier further comprises:
   a light emitter, disposed adjacent the container on the output, for emitting a light toward the container; and
   an optical sensor disposed in a reflective path of the light being reflected from a reflective surface when the container is a bad integrated circuit container, the light being absorbed by the container when the container is a good integrated circuit container.

25. The automated integrated circuit sorter of claim 19, wherein the integrated circuit stopper is comprised of a pin cylinder piston, disposed before the opening of the container on the output, for blocking the opening of the container when the container is a wrong container.

26. The automated integrated circuit sorter of claim 19, further comprising:
   a notification unit, operatively coupled to the data processor, for notifying a sorter operator when the container placed on the output is a wrong container.

27. An automated integrated circuit sorter for preventing binning of an integrated circuit into a wrong tube, the automated integrated circuit sorter comprising:
   a respective switch for an output track carrying the integrated circuit, the respective switch indicating that the integrated circuit is one of a good integrated circuit and a bad integrated circuit;
   a tube identifier for determining that a tube placed on the output track is one of a good integrated circuit tube and a bad integrated circuit tube, the tube identifier including:
      a light emitter, disposed adjacent the tube on the output track, for emitting a light toward the tube;
      an optical sensor disposed in a reflective path of the light being reflected from a reflective surface when the tube is a good integrated circuit tube, the light being absorbed by the tube when the tube is a bad integrated circuit tube;
      wherein a good integrated circuit tube is comprised of a clear material and wherein the reflective surface is a metal tube guide disposed on an opposite side of the tube from the light emitter and the optical sensor, and wherein the metal tube guide reflects the light emitted by the light emitter after the light goes through the good integrated circuit tube; and
      wherein a bad integrated circuit tube is comprised of a black patch
      disposed in the path of the light emitted by the light emitter for absorbing the light
   a stopper coupled to the output track, the stopper including a pin cylinder piston disposed before the opening of the tube on the output track;
   a data processor, operatively coupled to the respective switch, the tube identifier, and the pin cylinder piston, for controlling the pin cylinder piston to block the opening of the tube to prevent the integrated circuit from being admitted into the tube if the tube is a wrong tube, the tube being a wrong tube if the integrated circuit is a good integrated circuit and the tube is a bad integrated circuit tube, and if the integrated circuit is a bad integrated circuit and the tube is a good integrated circuit tube; and
   a notification unit, operatively coupled to the data processor, for notifying a sorter operator when the tube placed on the output track is a wrong tube.

28. An automated integrated circuit sorter for preventing binning of a tested integrated circuit into a wrong container, the automated integrated circuit sorter comprising:
   a respective switch for an output carrying the integrated circuit, the respective switch indicating that the integrated circuit is one of a good integrated circuit and a bad integrated circuit;
   a means for determining that a container placed on the output is one of a good integrated circuit container and a bad integrated circuit container; and
   means for preventing the integrated circuit from being admitted into the container on the output if the container is a wrong container, the container being a wrong container if the integrated circuit is a good integrated circuit and the container is a bad integrated circuit container, and if the integrated circuit is a bad integrated circuit and the container is a good integrated circuit container.

29. The automated integrated circuit sorter of claim 28, wherein the means for determining that the container is one of a good integrated circuit container and a bad integrated circuit container includes:
   a light emitter, disposed adjacent the container on the output, for emitting a light toward the container; and
   an optical sensor disposed in a reflective path of the light being reflected from a reflective surface when the container is a good integrated circuit container, the light being absorbed by the container when the container is a bad integrated circuit container.

30. The automated integrated circuit sorter of claim 28, wherein the means for preventing the integrated circuit from being admitted into the container if the container is a wrong container includes:
   a stopper coupled to the output, the stopper including a pin cylinder piston disposed before the opening of the container on the output; and
   a data processor, operatively coupled to the respective switch, the means for determining that the container is one of a good integrated circuit container and a bad integrated circuit container, and the pin cylinder piston, for controlling the pin cylinder piston to block the opening of the container to prevent the integrated circuit from being admitted into the container if the container is a wrong container.

31. The automated integrated circuit sorter of claim 28, further comprising:
   a notification unit, operatively coupled to the data processor, for notifying a sorter operator when the container on the output is a wrong container.

32. A method for automatically preventing binning of a tested integrated circuit into a wrong container, the method including the steps of:
   A. designating that the integrated circuit on an output is one of a good integrated circuit and a bad integrated circuit;

B. sensing and sending a control signal that a container placed on the output is one of a good integrated circuit container and a bad integrated circuit container; and C. preventing the admission of the integrated circuit into the container if the control signal indicates that the container is a wrong container, the container being a wrong container if the integrated circuit is a good integrated circuit and the container is a bad integrated circuit container, and if the integrated circuit is a bad integrated circuit and the container is a good integrated circuit container.

33. The method of claim 32, wherein step B further includes the steps of:

emitting a light toward the container; and sensing any reflection of the light, the light being reflected from a reflective surface when the container is a good integrated circuit container and the light being absorbed by the container when the container is a bad integrated circuit container.

34. The method of claim 33, wherein a good integrated circuit container is comprised of a reflective surface disposed on the good integrated circuit container and in the path of the light emitted by the light emitter.

35. The method of claim 33, wherein a good integrated circuit container is comprised of a clear material and wherein a metal container guide, disposed on an opposite side of the container from where the light is emitted, reflects the light after the light goes through the container.

36. The method of claim 33, wherein a bad integrated circuit container is comprised of a black patch disposed in the path of the light for absorbing the light.

37. The method of claim 32, wherein step C further includes the step of:

blocking the opening of the container with a pin cylinder piston to prevent the integrated circuit from being admitted into the container if the container is a wrong container.

38. The method of claim 32, further including the step of:

notifying a sorter operator when the container placed on the output is a wrong container.

* * * * *